(12) United States Patent
Tolman

(10) Patent No.: US 6,706,156 B1
(45) Date of Patent: *Mar. 16, 2004

(54) METHOD OF MAKING AN IMPROVED MR SENSOR

(75) Inventor: Charles H. Tolman, Bloomington, MN (US)

(73) Assignee: Seagate Technology LLC, Scotts Valley, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1002 days.

(21) Appl. No.: 08/854,407

(22) Filed: May 12, 1997

Related U.S. Application Data

(60) Provisional application No. 60/025,591, filed on Sep. 6, 1996.

(51) Int. Cl.[7] .............................................. C23C 14/34
(52) U.S. Cl. .............................. 204/192.2; 204/192.15; 204/192.21
(58) Field of Search .................... 204/192.15, 192.2, 204/192.21; 427/127, 128, 131, 132

(56) References Cited

U.S. PATENT DOCUMENTS

| | | | |
|---|---|---|---|
| 3,847,658 A | * 11/1974 | Kumagai ............... | 204/192.21 |
| 4,231,816 A | * 11/1980 | Cuomo et al. ............... | 428/416 |
| 4,364,099 A | * 12/1982 | Koyama et al. ............. | 361/305 |
| 4,470,873 A | 9/1984 | Nakamura .................... | 156/640 |
| 4,785,366 A | 11/1988 | Krounbi et al. ............. | 360/113 |
| 4,879,619 A | 11/1989 | Fontana, Jr. et al. ........ | 360/113 |
| 4,897,288 A | * 1/1990 | Jenson ......................... | 427/131 |
| 5,079,035 A | 1/1992 | Krounbi et al. ............. | 427/130 |
| 5,260,652 A | 11/1993 | Collver et al. ............... | 324/252 |
| 5,262,914 A | 11/1993 | Chen et al. .................. | 360/113 |
| 5,429,731 A | * 7/1995 | Osano et al. ................ | 204/192.2 |
| 5,458,908 A | 10/1995 | Krounbi et al. ............. | 427/123 |
| 5,495,378 A | * 2/1996 | Bonyhard et al. ........... | 360/113 |
| 5,554,265 A | 9/1996 | Bonyhard et al. ...... | 204/192.35 |

FOREIGN PATENT DOCUMENTS

JP 1-152255 * 6/1989 ............... 204/192.2

OTHER PUBLICATIONS

Translation of Japanese 01–152255.*

* cited by examiner

*Primary Examiner*—Rodney G. McDonald
(74) *Attorney, Agent, or Firm*—Kinney & Lange, P.A.

(57) ABSTRACT

A method of making a magnetoresistance sensor which detects stored information from a medium and which provides an output voltage to a auxiliary circuitry is disclosed. The method comprises sputtering a bias layer in a sputtering gas mixture of nitrogen and argon. A spacer layer is also formed in a sputtering gas mixture of nitrogen and argon. Finally, an MR magnetic layer is formed. The spacer layer is positioned between the bias layer and the magnetic layer. The output voltage is provided to auxiliary circuitry when a current flows through the MR magnetic layer.

16 Claims, 5 Drawing Sheets

|   | LAYER | THICKNESS ANG. | RESISTIVITY UOHM-CM | SHEET RESISTANCE OHMS/SQ | PARALLEL RESISTANCE RSP&RSAL OHMS/SQ | LAYER FRACTIONAL CURRENT | | | | | | OUTPUT SIGNAL V/VMAX % | OUTPUT SIGNAL INCREASE % |
|---|---|---|---|---|---|---|---|---|---|---|---|---|---|
|   |   |   |   |   |   | LAYERS A,B,C % | LAYERS A,B,D % | LAYERS A,B,E % | LAYERS A,E,F % | LAYERS A,E,G % | | | |
| A | MR MAGNETIC LAYER 52 (NiFe) | 200 | 30 | 15 |  | 70.8 | 82.3 | 84.2 | 86.8 | 88.3 |  |  |
| B | SPACER LAYER 54 (Ta) | 150 | 200 | 133 |  | 8.0 | 9.3 | 9.5 |  |  |  |  |
| C | BIAS LAYER SAL 56 (NiFeRe) | 200 | 100 | 50 | B&C: 36.3 | 21.2 |  |  |  |  | 50.0 (A,B,C) (STD.) |  |
| D | BIAS LAYER SAL 56 (SENDUST) | 130 | 190 | 146 | B&D: 69.6 |  | 8.5 |  |  |  | 67.7 (A,B,D) | (+35) |
| E | BIAS LAYER SAL 56 (SENDUSTw/N) | 145 | 290 | 200 | B&E: 79.9 |  |  | 6.3 | 6.5 | 6.6 | 70.9 (A,B,E) | (+42) |
| F | SPACER LAYER 54 (Ta w/2%n) | 150 | 290 | 193 | E&F: 98.2 |  |  |  | 6.7 |  | 75.3 (A,E,F) | (+51) |
| G | SPACER LAYER 54 (Ta w/4%n) | 150 | 390 | 260 | E&G: 113.0 |  |  |  |  | 5.1 | 77.9 (A,E,G) | (+56) |

Fig. 7

METHOD OF MAKING AN IMPROVED MR SENSOR

This application claims the priority benefit of a provisional U.S. patent application having application Ser. No. 60/025,591, filed on Sep. 6, 1996.

BACKGROUND OF THE INVENTION

The present invention is a method of making a magnetoresistive sensor for use in a magnetoresistive read device. In particular, the present invention is a method of making a magnetoresistive sensor having an improved bias layer and an improved spacer layer such that the sensor produces an efficient output voltage for a given applied sense current.

Magnetoresistive (MR) sensors or heads are used to read magnetically encoded information from a magnetic medium by detecting magnetic flux stored in the magnetic medium. During the operation of an MR sensor, a sense current is passed through the MR element of the sensor, causing a voltage drop across the MR element. The magnitude of the voltage drop is a function of the resistance of the MR element. The resistance of the MR element varies in the presence of a magnetic field. Therefore, as the magnitude of the flux from a medium transition passing through the MR element varies, the voltage drop across the MR element also varies. Differences in the magnitude of the magnetic flux from the medium entering the MR sensor can be detected by monitoring the voltage across the MR element.

An MR sensor will provide an approximately linear output when the magnetization vector M of the MR element and the current density vector J of the MR element form an angle of approximately 45 degrees. Permalloy, a typically MR element material and an alloy of nickel and iron (approximately 81% nickel and 19% iron) will naturally tend to form a magnetization vector along its long axis when it is formed into a long narrow strip. This alignment is enhanced by a magnetic field induced anisotropy formed during the deposition of the permalloy element. The current density vector J is also typically directed along the same axis. By forming a soft adjacent layer (SAL) or bias layer near the MR element and in a parallel plane to the plane of the MR element, the magnetization vector can be rotated up to 90 degrees with respect to the long axis. The amount of saturation inductance $B_S$ of the SAL or bias layer directly effects this angle. Once again, it is desirous for this bias angle to be approximately 45 degrees, for purposes of near-linear response of the sensor.

MR sensors of the SAL or bias layer design have three important layers. First, a magnetic layer with MR properties which generates an output voltage when its magnetization is rotated and a sense current flows through the layer. Second, a SAL or magnetic bias layer, with essentially no magnetoresistive properties or response. The SAL biases the MR magnetic layer from a rest position to a magnetized position. Due to the fields generated by the sense current in the various layers, and the magnetostatic coupling with the MR layer, magnetization in the SAL or bias layer is usually saturated along its hard magnetization direction. Third, a non-magnetic spacer layer is positioned between the two above described magnetic layers. The spacer layer breaks the ferromagnetic exchange coupling between the MR magnetic layer and the SAL allowing the magnetic layers to act as two distinct layers, rather than as one strongly coupled layer.

In order for an MR sensor to properly read information from a magnetic storage medium, several factors are important. First, as described above, the MR magnetic layer must be biased such that the magnetization vector M and the current density vector J form an angle of approximately 45 degrees. Second, it is critical to have as much of the sense current flowing through the MR magnetic layer of the sensor as possible. Third, a bias layer and/or a spacer layer with increased resistance will cause a reduced amount of shunting of the output voltage generated by the MR magnetic layer. Thus, it is important that the resistance of the SAL and the resistance of the spacer layer are significantly larger than the resistance of the MR magnetic layer. These three resistances are in parallel with one another, since these three layers are positioned side-by-side, or in a three layer stack. Maximizing the resistances of the SAL and the spacer layer will reduce their undesirable shunting effects, and thereby will generate an increase in the output voltage signal of the MR sensor.

It is, therefore, one object of the present invention to provide an MR sensor which includes a properly biased MR magnetic layer, i.e., the magnetization vector M and the current density vector J form an angle of approximately 45 degrees. It is another object of the invention to provide an MR sensor which maximizes the amount of sense current which flows through the MR magnetic layer of the MR sensor and which has less shunting of its output voltage by the layers in the sensor "stack," thereby maximizing the output voltage signal of the MR sensor.

SUMMARY OF THE INVENTION

A method of making a magnetoresistive sensor which detects information from a storage medium, such as a magnetic disc, and which provides an output voltage to a auxiliary circuitry is disclosed. The method comprises sputtering a bias layer (also known as a Soft Adjacent Layer (SAL)) in a sputtering gas mixture of nitrogen and argon. A spacer layer is also formed in a sputtering gas mixture of nitrogen and argon. Finally, an MR magnetic layer is formed. The spacer layer is positioned between the bias layer and the MR magnetic layer. The output voltage is provided to auxiliary circuitry when a bias current flows through the MR magnetic layer.

In one preferred embodiment, tantalum is vacuum sputter-deposited in a sputtering gas mixture of nitrogen and argon forming the spacer layer, while a Sendust-type alloy is sputter-deposited in a sputtering gas mixture of nitrogen and argon forming the bias layer.

BRIEF DESCRIPTION OF THE DRAWINGS

FIG. 7 is a table showing various properties for the three layers of the MR sensor.

DETAILED DESCRIPTION OF THE PREFERRED EMBODIMENTS

Figure 1:
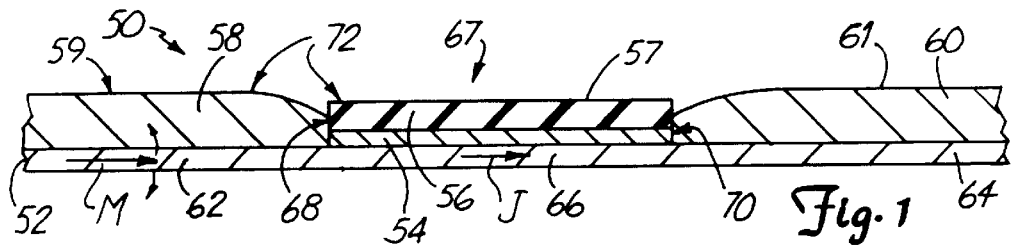
FIG. 1 is a sectional view of a magnetoresistive (MR) sensor configured in accordance with the present invention.

FIG. 1 is a sectional view of magnetoresistive (MR) sensor 50. The sectional view shown in FIG. 1 is taken from a plane parallel to the air bearing surface of the sensor. In other words, the air bearing surface of MR sensor 50 is parallel to the plane of the page. MR sensor 50 includes MR magnetic layer 52, spacer layer 54, soft adjacent layer (SAL) 56, and first and second permanent magnets or permanent magnet layer regions 58 and 60. SAL 56 is also known as a bias layer. While FIG. 1 depicts MR sensor 50 having SAL 56 positioned on top of spacer layer 54, which in turn is positioned on top of MR magnetic layer 52, it is understood that SAL 56 and MR magnetic layer 52 can be interchanged without varying from the present invention. This feature has been omitted from the drawings for clarity.

MR magnetic layer 52 includes first outer region 62, second outer region 64, and active or central region 66 which is positioned between outer regions 62 and 64. Permanent magnet region 58 has a first surface 59 and is positioned at least partially on top of first MR element outer region 62. Permanent magnet region 60 has a first surface 61 and is positioned at least partially on top of second MR element outer region 64. Gap region 67 is formed above MR element active region 66 and between permanent magnet regions 58 and 60.

Spacer layer 54 is positioned between permanent magnet regions 58 and 60 and on top of active region 66 of MR magnetic layer 52. SAL 56 is positioned on top of spacer layer 54 such that SAL 56 is also at least partially located between permanent magnet regions 58 and 60. Active region 67 of MR sensor 50 includes active region 66 of MR magnetic layer 52, spacer layer 54, and at least portions of SAL 56. In preferred embodiments, SAL 56 has a first surface 57 which is substantially coplanar with surfaces 59 and 61 of first and second permanent magnet regions 58 and 60. Permanent magnet regions 58 and 60 act as boundaries of active region 67 and make contact with spacer layer 54 and SAL 56 at junctions 68 and 70. Permanent magnet regions 58 and 60 also help to define active region 66 of MR magnetic layer 52.

MR magnetic layer 52 is, in preferred embodiments, a layer of permalloy. Permalloy is a name commonly used to identify any of a large number of highly magnetically permeable alloys containing a combination of nickel (Ni) and iron (Fe). It must be noted that other magnetoresistive materials can be used instead of permalloy. In preferred embodiments, the resistivity of MR magnetic layer 52 is less than 100 $\mu\Omega$-cm. MR magnetic layer 52 preferably has a thickness of between 25 and 400 angstroms (Å).

First and second permanent magnet regions 58 and 60 are preferably formed from a layer of high coercivity cobalt-platinum (CoPt). However, other ferromagnetic materials can be used instead of CoPt. The resistivity of permanent magnet regions 58 and 60 is preferably between 30 and 60 $\mu\Omega$-cm. In preferred embodiments, the thickness of permanent magnet regions 58 and 60 is between 200 and 1000 angstroms (Å).

Spacer layer 54 is a non-magnetic layer of high resistivity material which is positioned between SAL 56 and active region 66 of MR magnetic layer 52 to prevent magnetic exchange coupling between these two layers. The resistivity of spacer layer 54 is preferably substantially higher than that of MR magnetic layer 52 so that it shunts only a small amount of current away from active region 66 of MR magnetic layer 52, and also reduces the amount of shunting of the output voltage signal from MR magnetic layer 52. In preferred embodiments, spacer layer 54 is a layer of tantalum (Ta) having a resistivity of at least 100 $\mu\Omega$-cm and a thickness of between 25 and 400 angstroms (Å).

SAL 56 is preferably a layer of Sendust-type alloy which is made up of approximately 70 to 90% iron (Fe), up to 15% silicon (Si) and up to 15% aluminum (Al). Sendust-type alloys can also contain small amounts of additional elements, in dilute form, such as up to 5% titanium (Ti), chromium (Cr), vanadium (V), manganese (Mn), and/or zirconium (Zr), to name a few. The Sendust-type alloy forming SAL 56 can be formed in a variety of sputtering gases such as argon, neon, krypton, xenon and helium. SAL 56 can also be a layer of various ferromagnetic materials, for example nickel-iron-rhodium (NiFeRh), nickel-iron-rhenium (NiFeRe), or nickel-iron-chromium (NiFeCr), to name an additional few. The resistivity of SAL 56 is preferably at least 100 $\mu\Omega$-cm to reduce the shunting effects. SAL 56 has a preferred thickness of between 25 and 1000 angstroms and a preferred saturation inductance of at least 3 kilo-Gauss to properly bias MR magnetic layer 52.

First outer region 62 of MR magnetic layer 52 is inhibited from magnetic rotation by first high coercivity, low permeability permanent magnet region 58 through exchange coupling between layers. Second outer region 64 of MR magnetic layer 52 is inhibited from magnetic rotation by second permanent magnet region 60. Therefore, very little magnetic flux from a transition on a disc is absorbed into outer regions 62 and 64. This in turn helps to provide a well-defined reader track width. There is no permanent magnet region above active region 66 of MR magnetic layer 52, therefore, that region is not inhibited from magnetic rotation.

In operation, the air bearing surface of MR sensor 50 would be positioned adjacent to a magnetic storage medium. The magnetic storage medium is rotated so that the magnetic information located in the storage medium passes by the active region of the MR sensor. A sense current flows through MR sensor 52. It is desirous to have a maximum amount of sense current flow through magnetic layer 52 of MR sensor 50, in order to more effectively read information stored on the magnetic storage medium. Once the sense current has flowed through MR sensor 50, auxiliary circuitry manipulates the MR sensor output in order to recover stored data from the magnetic storage medium.

Figure 2:
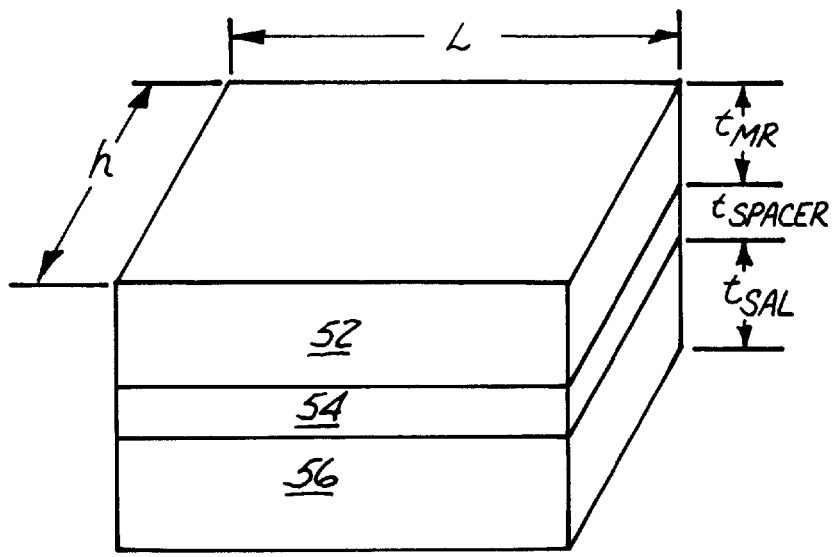
FIG. 2 is a layered diagram of the MR sensor in accordance with the present invention.
Figure 3:
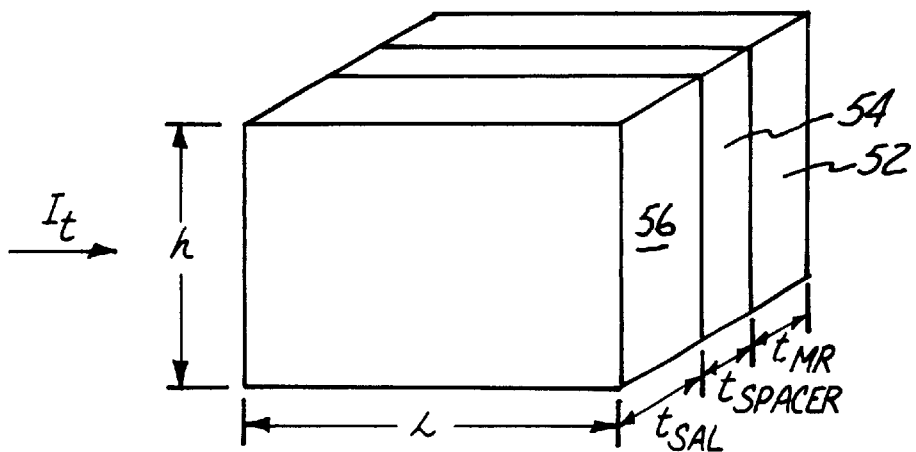
FIG. 3 is a layered diagram of the MR sensor shown in FIG. 2 rotated 90 degrees.
Figure 4:
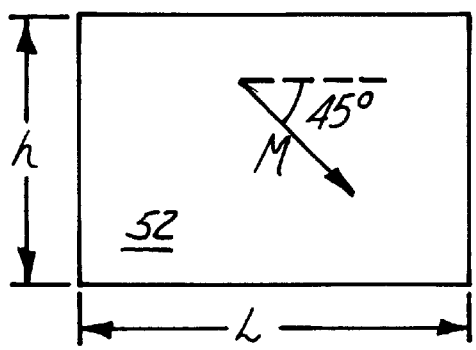
FIG. 4 is a side view of the MR magnetic layer of the MR sensor shown in FIG. 3 in accordance with the present invention.
Figure 5:
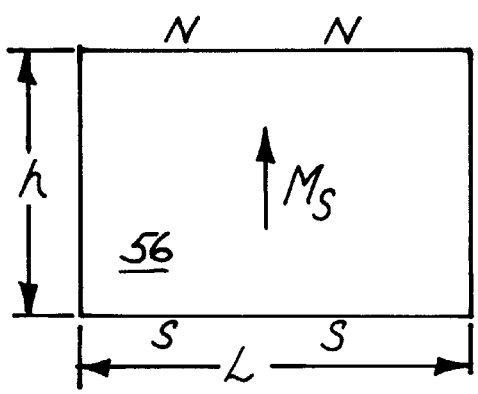
FIG. 5 is a side view of the SAL of the MR sensor shown in FIG. 3 in accordance with the present invention.

FIG. 2 is a layered diagram of MR sensor 50 in accordance with the present invention, while FIG. 3 is a layered diagram of MR sensor 50 shown in FIG. 2 rotated 90 degrees. FIGS. 2 and 3 show only the active region of MR sensor 50. FIG. 4 is a side view of MR magnetic layer 52 of MR sensor 50 shown in FIG. 3, while FIG. 5 is a side view of SAL 56 of MR sensor 50 shown in FIG. 3. As shown in FIGS. 2 and 3, MR magnetic layer 52, spacer layer 54 and SAL 56 each have a given length, height and thickness.

MR magnetic layer 52 will naturally tend to align its magnetization vector M along its long axis when it is formed. For purposes of explanation, it will be assumed that natural magnetization vector M of active region 66 in MR magnetic layer 52 points in the direction as shown in FIG. 1 and the non-rotated direction of FIG. 4. Current density vector J is formed in MR magnetic layer 52 as current passes through MR sensor 50 during its operation. It is assumed that current flows through MR sensor 50, and thus through MR magnetic layer 52 in the direction as viewed in FIG. 1.

Therefore, current density vector J in active region 66 points in the same direction as natural magnetization vector M in this example.

The resistance of MR magnetic layer 52 will vary nearly linearly with the magnitude of magnetic flux from the storage medium entering MR magnetic layer 52 when magnetization vector M and current density vector J form an angle of approximately 45 degrees. Thus, to achieve a nearly linear response from MR sensor 50, natural magnetization vector M of MR magnetic layer 52 is rotated by forming SAL 56 above active region 66. The magnetic field of SAL 56 and the current flowing in spacer layer 54 and SAL 56, and the magnetostatic coupling between active region 66 and SAL 56 (shown in FIG. 5) causes natural magnetization vector M of MR magnetic layer 52 to rotate, as illustrated in FIG. 4.

In order for SAL 56 to help to proper bias MR magnetic layer 52 from a rest position (where the angle between magnetization vector M of MR magnetic layer 52 and current density vector J of MR magnetic layer 52 is 0 degrees) to a magnetized position (where the angle between magnetization vector M and current density vector J is approximately 45 degrees), the flux level of SAL 56 should be between 0.50 to 0.75 of the flux level of MR layer 52. Within this range, SAL 56 will help to properly bias MR magnetic layer 52 such that the angle between magnetization vector M and current density vector J of MR magnetic layer 52 is approximately 45 degrees. The flux level from a given layer in the product of its saturation induction $B_S$ times the thickness and times the active sensor length. The flux will need to vary in this range depending on the magnetic and dimensional properties of MR magnetic layer 52 and SAL 56. If the flux is not within this range, MR magnetic layer 52 will not be properly biased. In other words, the angle between magnetization vector M and current density vector J of MR magnetic layer 52 could be up to 90 degrees or could be as little as 0 degrees. With these values, magnetic sensor 52 will not properly read information stored on the magnetic storage medium.

Figure 6:
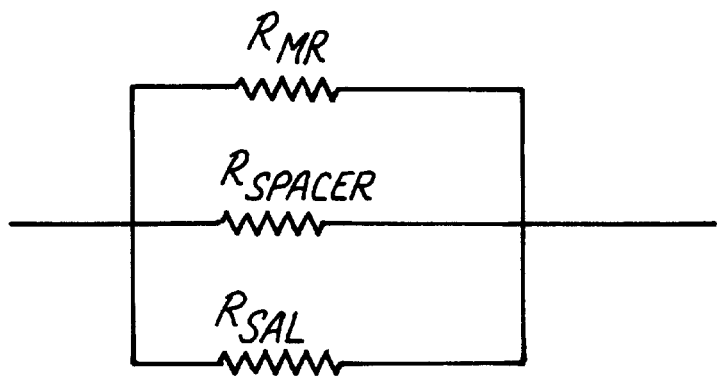
FIG. 6 is an electrical representation of the MR sensor shown in FIG. 3 in accordance with the present invention.

Examples of various materials and dimensions which can be utilized to build MR sensor 50 will now be further described. In order for MR sensor 50 to properly and accurately read information from the magnetic storage medium, it is critical to maximize the amount of sense current flowing through MR magnetic layer 52 (within limits) and minimize the amount of sense current flowing through spacer layer 54 and SAL 56. FIG. 6 is an electrical representation of MR sensor 50 in accordance with the present invention. As shown in FIG. 6, the resistances of MR magnetic layer 52, spacer layer 54 and SAL 56 are all in parallel with one another. Thus, in order to maximize the amount of sense current flowing through MR magnetic layer 52, the resistance of spacer layer 54 and SAL 56 should be maximized.

There are several methods of maximizing the resistance of SAL 56 of MR sensor 50. One method is to determine the resistive shunting effect of SAL 56 by determining the product of that layer's saturation inductance $B_S$ times the resistivity $\rho$ of the layer. This method begins with the following equation:

$$R_{SAL} = (\rho L/ht)_{SAL}$$

where $\rho$ is the resistivity, L is the length, h is the height and t is the thickness of the material.

The magnetic flux of SAL 56 should be approximately equal to 0.60 to 0.75 of the magnetic flux MR magnetic layer 52 to ensure proper biasing of MR magnetic layer 52. The magnetic flux of SAL 56 is equal to its saturation inductance $B_S$ times the length of SAL 56 times the thickness of SAL 56. Thus, the magnetic flux of SAL 56 is equal to 0.60 to 0.75 times the saturation inductance of MR magnetic layer 52 times the length of MR magnetic layer 52 times the thickness of MR magnetic layer 52. Using a valve of 0.65 for the ratio, the following equation applies:

$$(B_S \times L \times t)_{SAL} = 0.65 (B_S \times L \times t)_{MR}$$

Since the length of SAL 56 is equal to the length of MR magnetic layer 52, we can solve for the thickness of SAL 56 through use of the following equation:

$$t_{SAL} = 0.65 (B_S \times t)_{MR} / (B_S)_{SAL}$$

The resistance of SAL 56 can then be determined for by substituting $t_{SAL}$ into the previous equation for $R_{SAL}$:

$$R_{SAL} = (\rho \times L/h)_{SAL} \times (B_S)_{SAL} / (0.65 B_S \times t)_{MR}$$

Thus, $$R_{SAL} = C \times (B_S \times \rho)_{SAL}$$

for a given design, where C is a constant for a given design. Thus, in order to maximize the resistance of SAL 56, it is critical to maximize the product of the saturation inductance $B_S$ and the resistivity $\rho$ of SAL 56.

If a ferromagnetic material such as nickel-iron-rhenium (NiFeRe) is used for SAL 56, the saturation inductance $B_S$ is approximately 6,000 Gauss and the resistivity $\rho$ is approximately 100 micro ohm-centimeters. Thus, the product of these figures is 600 kilo-Gauss×micro ohm-centimeters (KG×$\mu\Omega$-cm). This figure of merit is somewhat low. However, by forming SAL 56 from a Sendust-type alloy (70 to 90% Fe, up to 15% Si, up to 15% Al as previously discussed), the saturation inductance $B_S$ increases to approximately 10,500 Gauss and the resistivity $\rho$ increases to approximately 180 to 190 micro ohm-centimeters. The product of these two figures is approximately 1,900 kilo-Gauss×micro ohm-centimeters (KG×$\mu\Omega$-cm). Thus, by using a SAL made from a Sendust-type alloy, the figure of merit of the saturation inductance $B_S$ times the resistivity $\rho$ of the layer is more than tripled. The resistance of SAL 56 has, therefore, more than tripled.

A second method for maximizing the resistive shunting effect of SAL 56 is by manipulating the thickness and the resistivity of SAL 56. A resistance of a given layer is equal to the resistivity of that layer divided by the thickness of that layer. FIG. 7 is a table showing various properties for the three layers of magnetic sensor 50. It will be noticed that various sets of data have been shown for spacer layer 54 and SAL 56.

As shown in FIG. 7, SAL 56 formed from a Sendust-type alloy has a much greater sheet resistance (146 $\Omega$/SQ) then SAL 56 formed from nickel-iron-rhenium (50 $\Omega$/SQ). The parallel resistance of spacer 54 and SAL 56 increases from 36.3 $\Omega$/SQ (rows B and C) to 69.6 $\Omega$/SQ (rows B and D) by utilizing a Sendust-type alloy rather than nickel-iron-rhenium for SAL 56. Thus, the current which flows through MR magnetic layer 52, as shown in FIG. 7, greatly increases from 70.8% of the total current (rows A, B, C) to 82.3% of the total current (rows A, B, D). Likewise, the amount of available signal V/V$_{MAX}$ which could be read by MR magnetic layer 52 dramatic increases from 50% of available signal (rows A, B, C) to 67.7% of available signal (rows A, B, D), due to the increased MR current and reduced output voltage shunting, for the same total sense current. The amount of available signal which can be read by auxiliary circuitry is calculated by squaring the total current flowing through MR magnetic layer 52, i.e. squaring 70.8 equals 50.0. Finally, by dividing 67.7% by 50%, a factor of 1.35 is achieved. Thus, the voltage signal coming out of MR sensor 50 which includes SAL 56 made up of a Sendust-type alloy is 35% larger than that of MR sensor 50 having SAL 56 made up of nickel-iron-rhenium, thereby providing an output with a larger signal to noise ratio.

To illustrate the above improvements, assume that between 10–12 milliamps of current flows through MR sensor 50. If MR sensor 50 would provide a 600 microvolt output current using SAL 56 formed of nickel-iron-rhenium, MR sensor 50 would then provide approximately a 815 microvolt output current using SAL 56 formed of a Sendust-type alloy.

While manipulating the materials which form SAL 56 has greatly increase the efficiency of MR sensor 50, it has also been determined that manipulating the fabrication process of SAL 56 also greatly increases the efficiency of MR sensor 50.

When fabricating SAL 56 from a Sendust-type alloy, a sputtering gas is typically used in the vacuum sputtering process to deposit the layer of the Sendust-type alloy. Using only argon for the sputtering gas mixture provides the above described results (rows A, B, D) and provides that the saturation inductance $B_S$ of Sendust-type alloy SAL 56 is approximately 10,500 Gauss and the resistivity $\rho$ of SAL 56 is approximately 190 micro ohm-centimeters, when the thickness is relatively small (130 angstroms). Thus, the product of the saturation inductance times the resistivity is approximately 2000 kilo-Gauss×micro ohm-centimeters. Other gases can be used in the sputtering process, such as helium (He), neon (Ne), krypton (Kr), xenon (Xe) and radon (Rn).

Providing a sputtering gas mixture of nitrogen in argon greatly improves the saturation inductance $B_S$ times resistivity $\rho$ figure of merit of Sendust-type alloy SAL 56. For example, using a mixture of 2% nitrogen in argon provides a saturation inductance $B_S$ of approximately 9600 Gauss and a resistivity $\rho$ of approximately 240 micro ohm-centimeters for a given gas flow and layer deposition rate. Thus, the saturation inductance figure of merit is increased to 2300 kilo-Gauss×micro ohm-centimeters.

A greater percent of nitrogen in argon increases the figure of merit of SAL 56 even more. By utilizing a gas mixture of 4% nitrogen in argon provides for a saturation inductance $B_S$ of approximately 8900 Gauss and a resistivity $\rho$ of approximately 290 micro ohm-centimeters. Thus, the saturation inductance $B_S$ times resistivity $\rho$ figure of merit increases to approximately 2,600 kilo-Gauss micro ohm-centimeters. As shown in row E of FIG. 7, the parallel resistance of SAL 56 and spacer layer 54 equals 79.9 ohms (rows A, B, E). Following the table of FIG. 7, MR magnetic layer 52 receives 84.2% of the total current and the output signal increases to 70.9%. Thus, there is a 42% increase in the output signal as compared to the output signal of rows A, B, C of FIG. 7.

The percent of gases such as nitrogen incorporated into a deposited layer can vary through a variety of methods. First, the higher the total nitrogen plus argon gas pressure during the fabrication process, the more nitrogen will be incorporated into the deposited SAL layer. Second, the larger the sputtering power, the faster the film would be deposited and thus, less nitrogen would be incorporated. Other factors include film deposition rate and sputtering power, internal spacing of the target to substrate, and a bias sputtering condition where a voltage on the substrate may take off an amount of the layer. These variations improve the efficiency of MR sensor 50 so that the output signal is much larger than previously obtainable.

The above methods of utilizing a sputtering gas mixture of nitrogen and argon also has dramatic affects on the resistivity $\rho$ of spacer layer 54. As previously discussed and shown in FIG. 7, row B, spacer layer 54 is normally formed of tantalum (Ta). As shown in FIG. 7, row B, in fabricating spacer layer 54 from tantalum through use of a strictly argon sputtering gas, the resistivity $\rho$ of the spacer layer is approximately 200 micro ohm-centimeters for layers having a thickness of 150 angstroms. To ensure proper performance, spacer layer 54 should have a thickness in the range of 50 to 300 angstroms.

It has been determined that a sputtering gas mixture of nitrogen and argon will greatly increase the resistivity of spacer layer 54 similar to the large increase in the resistivity of SAL bias layer 56. As shown in FIG. 7, row F, spacer layer 54 having a thickness of 150 angstroms and fabricated of tantalum in a sputtering gas mixture of 2% nitrogen in argon has a resistivity of 290 micro ohm-centimeters and a sheet resistance of 193 $\Omega$/SQ. The parallel resistance of spacer 54 and SAL 56 (NiFeRe) increases from 36.3 $\Omega$/SQ (rows B and C) to 98.2 $\Omega$/SQ (rows E and F), with SAL 56 formed in a sputtering gas mixture of 4% nitrogen in argon. Thus, the current which flows through MR magnetic layer 52 increases from 70.8% of the total current (rows A, B, C) to 86.8% of the total current (rows A, E, F). Likewise, the amount of available signal which could be read by MR magnetic layer 52 dramatically increases from 50% of the available signal (rows A, B, C) to 75.3% of the available signal (rows A, E, F). Finally, by dividing 75.3% by 50%, a factor of 1.51 is achieved. Thus, the voltage signal coming out of MR sensor 50 which includes spacer layer 54 fabricated from tantalum through use of a sputtering gas of 2% nitrogen in argon, and SAL layer (e) with 4% nitrogen, is 51% greater.

As shown in FIG. 7, row G, fabricating spacer layer 54 from tantalum in a sputtering gas mixture of 4% nitrogen in argon produces an even greater output readable signal than previously discussed. Having a thickness of 150 angstroms, spacer layer 54 formed in a sputtering as mixture of 4% nitrogen in argon provides a resistivity of 390 micro ohm-centimeters and a sheet resistance of 260 $\Omega$/SQ. The parallel resistance of spacer 54 and SAL 56 (layer E) is then 113.0 $\Omega$/SQ. Thus, the current which flows through MR magnetic layer 52 is 88.3% of the total current (rows A, E, G). Following row G of FIG. 7, 77.9% of the available signal can be read by MR sensor 50. This is a 56% increase as compared to an MR sensor formed from MR magnetic layer 52, spacer layer 54 and SAL 56 shown in rows A, B and C of FIG. 7.

The substantial increase in resistivity of spacer layer 54 and SAL 56 greatly improves the efficiency of MR sensor 50 so that the output signal from MR sensor 50 is much larger than previously obtainable.

Figure 8:
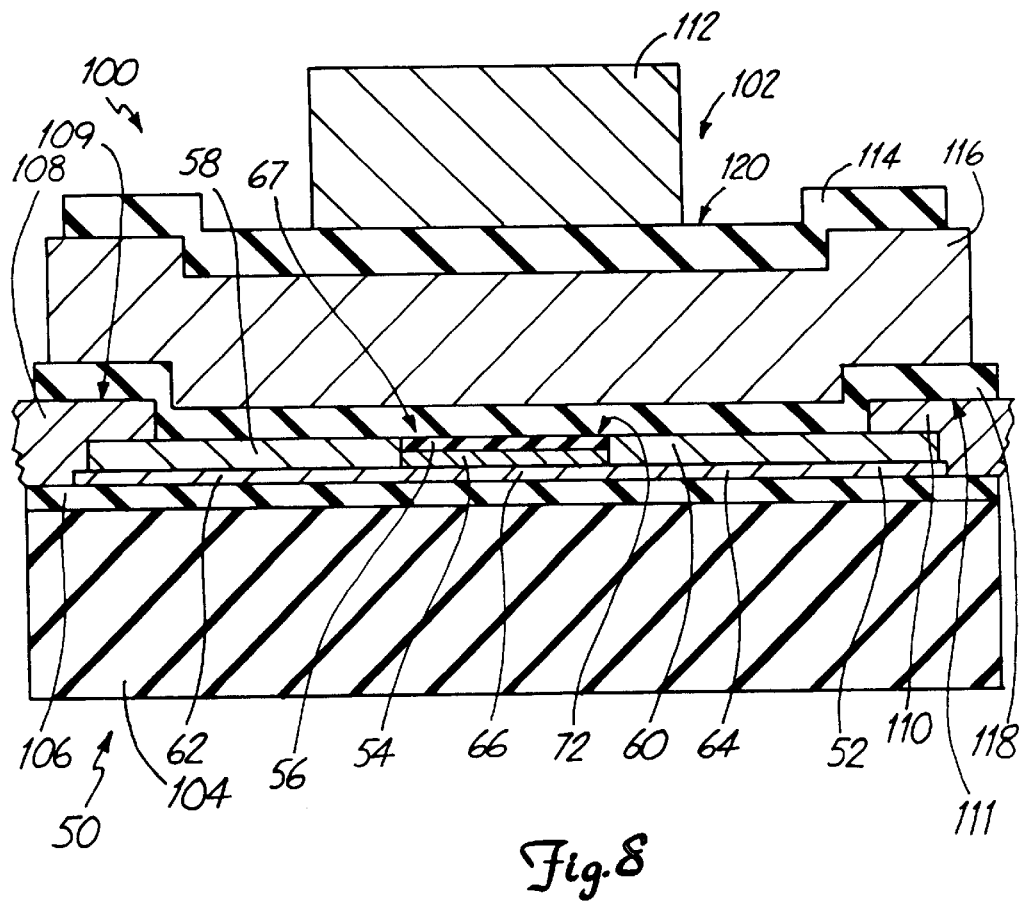
FIG. 8 is a sectional view of a magnetic head having an inductive write head fabricated on top an MR sensor in accordance with the present invention.

FIG. 8 illustrates a magnetic head which has an inductive write head or transducer fabricated on top of reader gap 118 of MR sensor 50. FIG. 8 is a sectional view of magnetic device 100 which includes inductive write head 102 and MR read sensor 50. MR sensor 50 is substantially the same as described with reference to FIG. 1. MR sensor 50 is shown fabricated on top of shield layer 104 and insulating layer 106. Conductors or contacts 108 and 110 have been added to MR sensor 50 for connecting MR sensor 50 to bond pads and external circuitry. Write head 102 includes top pole layer 112, write gap layer 114, and shared pole layer 116. Layers 106 and 118 are referred to as reader "half-gaps."

As can be seen in FIG. 8, conductors 108 and 110 are positioned on top of permanent magnet regions 58 and 60, MR element outer regions 62 and 64, and gap layer 106. Conductors 108 and 110 are regions of a conductor layer which is typically between 1000 Å and 5000 Å thick. As shown in FIG. 2, the placement of conductors 108 and 110 is away from the active region or central portion of MR sensor 50 which allows the sensor to maintain substantially planar surface 72 on which gap layer 118 and subsequent layers of write head 102 can be deposited. Because permanent magnet regions 58 and 60 help to define active region 66 of MR magnetic layer 52, conductors 108 and 110 need not be deposited near the central portion of MR sensor 50.

The planarity of surface 72 allows the central portion of layer 118 to be formed upon an essentially flat surface. This correspondingly allows the central portions of shared pole 116 and write gap layer 114 to be formed upon essentially flat surfaces, so that top pole 112 can be formed on a truly flat surface. Shared pole 116 is now flat at the edges of the track, as opposed to rising over the contacts at the edge of the track as in previous designs. This results in improved side reading characteristics.

Figure 9:
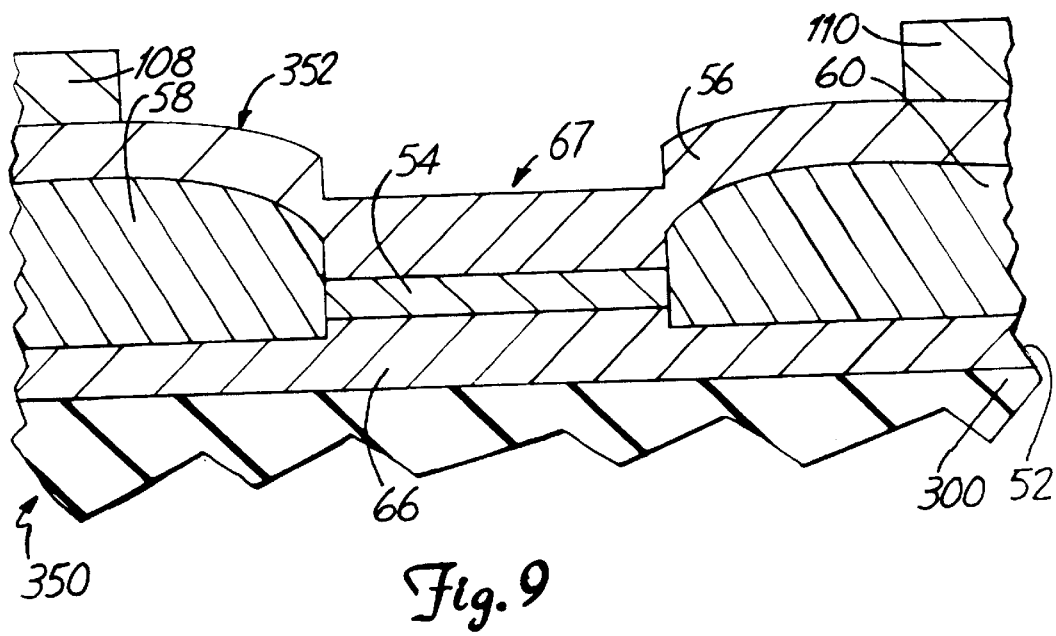
FIG. 9 is a sectional view of an alternate embodiment of an MR sensor in accordance with the present invention.

FIG. 9 is a sectional view of an alternate embodiment of MR sensor 350 in accordance with the present invention. As can be seen from FIG. 9, several features of MR sensor 350 are identical to MR sensor 100 of FIG. 8. However, SAL 56 shown in FIG. 9 has been expanded to be positioned on top of both spacer layer 54 and permanent magnet layer regions 58 and 60. In addition, it is noted that magnetic layer 52 and SAL layer 56 can be positioned interchangeably, as long as spacer layer 54 is positioned between the two.

Although the present invention has been described with reference to preferred embodiments, workers skilled in the art will recognize that changes may be made in form and detail without departing from the spirit and scope of the invention.

What is claimed is:

1. A method of making a magnetoresistive sensor which detects stored information from a medium and which provides an output voltage to auxiliary circuitry, the method comprising:

sputtering a bias layer formed from at least iron, silicon, and aluminum, comprising 70 to 90 percent iron, up to 15 percent silicon, and up to 15 percent aluminum in a sputtering gas mixture of nitrogen in argon to incorporate an amount of nitrogen into the bias layer sufficient to cause a saturation inductance times resistivity product of the bias layer to exceed about 1,900 kilo-Gauss times micro-ohm centimeters;

sputtering a spacer layer in a sputtering gas mixture of nitrogen in argon to incorporate an amount of nitrogen into the spacer layer sufficient to cause a resistivity of the spacer layer to exceed about 200 micro-ohm centimeters, wherein increasing from zero a percentage of nitrogen in the sputtering gas mixture correspondingly increases the resistivity of the spacer layer;

forming a magnetoresistive magnetic layer from ferromagnetic material;

wherein the spacer layer is positioned between the bias layer and the magnetic layer;

wherein the output voltage is provided to the auxiliary circuitry when a current flows through the magnetoresistive sensor; and wherein the incorporation of nitrogen into each of the spacer and bias layers results in each of the spacer and bias layers having an increased resistance, thereby causing greater percentage of current flowing through the magnetoresistive sensor to flow through the magnetic layer than flows through a magnetic layer of a magnetoresistive sensor not having nitrogen incorporated into its spacer and bias layers.

2. The method of claim 1 wherein the step of sputtering a spacer layer further comprises:

sputtering tantalum in the sputtering gas mixture of nitrogen in argon.

3. The method of claim 1 wherein the spacer layer is formed having a thickness in the range of about 25 angstroms to about 400 angstroms.

4. The method of claim 1 wherein the step of sputtering a bias layer further comprises:

sputtering a Sendust alloy in the sputtering gas mixture of nitrogen in argon.

5. The method of claim 1 wherein the bias layer is formed having a thickness in the range of about 25 angstroms to about 1000 angstroms.

6. A method of making a magnetoresistive sensor which detects stored information from a medium and which provides an output voltage to auxiliary circuitry, the method comprising:

sputtering a bias layer formed from at least iron, silicon, and aluminum, comprising 70 to 90 percent iron, up to 15 percent silicon, and up to 15 percent aluminum in a sputtering gas mixture of nitrogen in argon to incorporate an amount of nitrogen into the bias layer sufficient to cause a saturation inductance times resistivity product of the bias layer to exceed about 1,900 kilo-Gauss times micro-ohm centimeters;

forming a spacer layer;

forming a magnetoresistive magnetic layer;

wherein the spacer layer is positioned between the bias layer and the magnetic layer;

wherein the output voltage is provided to the auxiliary circuitry when the sense current flows through the magnetoresistive sensor, and wherein the incorporation of nitrogen into the bias layer results in the bias layer having an increased resistance, thereby causing greater a greater percentage of current flowing through the magnetoresistive sensor to flow through the magnetic layer than flows through a magnetic layer of a magnetoresistive sensor not having nitrogen incorporated into its bias layer.

7. The method of claim 6 when the spacer layer is formed by sputtering a spacer layer material in a sputtering gas mixture of nitrogen in argon.

8. The method of claim 7 wherein the spacer layer material is tantalum.

9. The method of claim 6 wherein the spacer layer is formed having a thickness in the range of about 25 angstroms to about 400 angstroms.

10. The method of claim 6 wherein the step of sputtering a bias layer further comprises:

sputtering a Sendust alloy in the sputtering gas mixture of nitrogen in argon.

11. The method of claim 6 wherein the bias layer is formed having a thickness in the range of about 25 angstroms to about 1000 angstroms.

12. In a method for forming a magnetoresistive sensor comprising
   depositing a magnetic layer;
   depositing a spacer layer; and
   depositing a bias layer, wherein the spacer layer is positioned between the magnetic layer and the bias layer,
an improvement for ensuring that a greater percentage of current through the magnetoresistive sensor flows through the magnetic layer of the magnetoresistive sensor than flows in a magnetic layer of a magnetoresistive sensor formed by an unimproved method of forming a magnetoresistive sensor, the improvement comprising:
   sputter depositing the spacer layer in a sputtering gas mixture of nitrogen in argon to incorporate an amount of nitrogen into the spacer layer sufficient to cause a resistivity of the spacer layer to exceed about 200 micro-ohm centimeters, wherein increasing from zero a percentage of nitrogen in the sputtering gas mixture correspondingly increases the resistivity of the spacer layer; and
   sputter depositing the bias layer in a sputtering gas mixture of nitrogen in argon to incorporate an amount of nitrogen into the bias layer sufficient to cause a saturation inductance times resistivity product of the bias layer to exceed about 1,900 kilo-Gauss times micro-ohm centimeters.

13. The method of claim 12 wherein the spacer layer is formed from tantalum.

14. The method of claim 12 wherein the spacer layer is deposited to a thickness in the range of about 25 Angstroms to about 400 Angstroms.

15. The method of claim 12 wherein the soft adjacent layer is formed from a Sendust alloy.

16. The method of claim 12 wherein the soft adjacent layer is deposited to a thickness in the range of about 25 Angstroms to about 1000 Angstroms.

* * * * *

UNITED STATES PATENT AND TRADEMARK OFFICE
CERTIFICATE OF CORRECTION

PATENT NO. : 6,706,156 B1
DATED : March 16, 2004
INVENTOR(S) : Charles H. Tolman It is certified that error appears in the above-identified patent and that said Letters Patent is hereby corrected as shown below:

<u>Column 6,</u>
Line 20, delete "$R_{SAL}=(\rho \times L / h)_{SAL} \times (B_{S)SAL}/(0.65B_S xt)_{MR}$" insert
-- $R_{SAL} = (\rho \times L / h)_{SAL} \times (B_S)_{SAL} / (0.65B_S \times t)_{MR}$ --

Signed and Sealed this

Twenty-second Day of March, 2005

JON W. DUDAS
*Director of the United States Patent and Trademark Office*